United States Patent
Risso et al.

(10) Patent No.: US 8,510,642 B2
(45) Date of Patent: Aug. 13, 2013

(54) SYSTEM AND METHOD FOR MAP DETECTOR FOR SYMBOL BASED ERROR CORRECTION CODES

(75) Inventors: Alessandro Risso, San Diego, CA (US); Mustafa N. Kaynak, San Diego, CA (US); Patrick Khayat, San Diego, CA (US)

(73) Assignee: STMicroelectronics, Inc., Coppell, TX (US)

( * ) Notice: Subject to any disclaimer, the term of this patent is extended or adjusted under 35 U.S.C. 154(b) by 656 days.

(21) Appl. No.: 12/653,615

(22) Filed: Dec. 16, 2009

(65) Prior Publication Data

US 2011/0075287 A1    Mar. 31, 2011

Related U.S. Application Data (60) Provisional application No. 61/245,996, filed on Sep. 25, 2009.

(51) Int. Cl.
*H03M 13/03* (2006.01)

(52) U.S. Cl.
USPC .......................................... 714/786

(58) Field of Classification Search
USPC ......................................... 714/786, 791–796
See application file for complete search history.

(56) References Cited

U.S. PATENT DOCUMENTS

| | | | |
|---|---|---|---|
| 7,016,440 B1 * | 3/2006 | Singer et al. ................. | 375/350 |
| 7,020,185 B1 * | 3/2006 | Balachandran et al. ...... | 375/219 |
| 7,685,494 B1 * | 3/2010 | Varnica et al. ................ | 714/752 |
| 7,876,860 B1 * | 1/2011 | Varnica et al. ................ | 375/340 |
| 2003/0161388 A1 * | 8/2003 | Schilling ........................ | 375/147 |
| 2004/0225940 A1 * | 11/2004 | Kerr et al. ...................... | 714/752 |
| 2004/0264555 A1 * | 12/2004 | Hegde et al. ................... | 375/148 |
| 2005/0180492 A1 * | 8/2005 | Dent ............................... | 375/144 |
| 2007/0030926 A1 * | 2/2007 | Brown et al. ................... | 375/340 |
| 2007/0061666 A1 * | 3/2007 | Nakai ............................. | 714/755 |
| 2007/0217626 A1 * | 9/2007 | Sharma et al. ................. | 381/100 |
| 2007/0274418 A1 * | 11/2007 | Hegde et al. ................... | 375/341 |
| 2008/0215831 A1 * | 9/2008 | Argon et al. .................... | 711/157 |
| 2009/0249165 A1 * | 10/2009 | Gracie et al. ................... | 714/758 |
| 2010/0098185 A1 * | 4/2010 | Miyazaki ....................... | 375/267 |
| 2011/0131264 A1 * | 6/2011 | Hars ............................... | 708/254 |

* cited by examiner

*Primary Examiner* — Michael Maskulinski
*Assistant Examiner* — Neil Miles
(74) *Attorney, Agent, or Firm* — Munck Wilson Mandala, LLP (57) ABSTRACT

A system for decoding data includes a symbol based error correction code device. The error correction code device includes a channel detector configured to generate probability mass function (PMF) information. The error correction code device further includes a decoder coupled to the channel detector. The decoder is configured to use the PMF information from the channel detector to perform an error correction code operation. The decoder also is configured to generate PMF information. The channel detector is configured to receive extrinsic PMF information in a turbo equalization scheme.

20 Claims, 4 Drawing Sheets

SYSTEM AND METHOD FOR MAP DETECTOR FOR SYMBOL BASED ERROR CORRECTION CODES

CROSS-REFERENCE TO RELATED APPLICATION(S) AND CLAIM OF PRIORITY

The present application is related to U.S. Provisional Patent No. 61/245,996, filed Sep. 25, 2009, entitled "SYSTEM AND METHOD FOR MAP DETECTOR FOR Q'ARY LOW DENSITY CHECK PARITY CODES". Provisional Patent No. 61/245,996 is assigned to the assignee of the present application and is hereby incorporated by reference into the present application as if fully set forth herein. The present application hereby claims priority under 35 U.S.C. §119(e) to U.S. Provisional Patent No. 61/245,996.

TECHNICAL FIELD OF THE INVENTION

The present application relates generally to channel detection/error correction code decoding systems and, more specifically, to a system and method for decoding data with a symbol based error correction code, such as a Q'ary LDPC Code.

BACKGROUND OF THE INVENTION

Several communications systems, including magnetic recording channels, experience inter-symbol-interference (ISI). In general, a channel detector is employed to recover ISI channel inputs. Usually, a maximum-a-posteriori (MAP) detector or soft output Viterbi algorithm (SOVA) is used as the channel detector. Both detectors compute soft information (likelihood information) which might be used by an outer error correction code.

In order to improve reliability of communication systems, conventional systems employ different error correction codes. Among these, a Low Density Parity Check (LDPC) code is an excellent error correction code (ECC). The LDPC codes can be applied to a variety of communication systems, including magnetic recording channels.

SUMMARY OF THE INVENTION

A system for decoding data is provided. The system includes a symbol based error correction code device. The system includes a channel detector configured to generate probability mass function (PMF) information. The system further includes a decoder coupled to the channel detector. The decoder is configured to use the extrinsic PMF information from the channel detector to perform an error correction code operation. The decoder also is configured to generate extrinsic PMF information for use in the channel detector. Optionally, one may use a symbol based interleaver between the channel detector and ECC decoder.

A magnetic drive apparatus for use in a data decoding system is provided. The magnetic drive apparatus includes a channel detector configured to recover inter-symbol-interference channel inputs and generate a first set of PMF information based on the channel outputs. The magnetic drive apparatus also includes an ECC decoder configured to perform a symbol-based error correction code operation. The detector further is configured to output the PMF information to the ECC decoder. The ECC decoder is configured to use the PMF information to perform an error correction code operation.

A method for decoding data is provided. The method includes receiving inter-symbol-interference channel outputs. A channel detector generates PMF information (symbol probabilities) based at least in part on the received channel outputs. The method also includes performing a symbol based error correction code operation using the PMF information from the channel detector; and generating full PMF information from the first PMF information for used in the channel detector.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

Properly designed symbol-based LDPC codes (Q'ary LDPC or "QLDPC" codes), can outperform a similar rate binary LDPC code over perpendicular magnetic channels at the expense of increased encoder and decoder complexity. Accordingly, symbol based ECCs can be utilized in multiple applications for several communications systems for their superior error correction capabilities. For example, the symbol based ECC can be included in a device that reads data from a magnetic communication medium.

Figure 1:
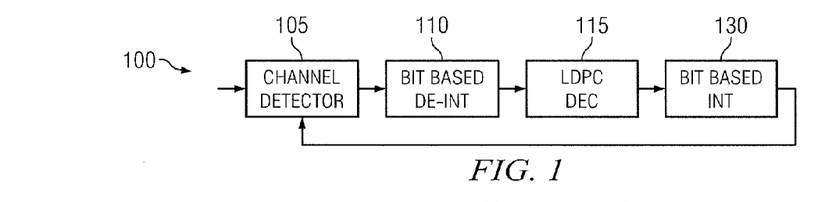
FIG. 1 illustrates a binary (bit-based) error correction code (ECC) device according to the present disclosure.

FIG. 1 illustrates a binary (bit-based) LDPC based ECC device according to the present disclosure. The ECC device 100 shown in FIG. 1 is for illustration only. Other embodiments could be used without departing from the scope of this disclosure.

The ECC device 100 includes a channel detector 105, such as a MAP or SOVA detector. The output of the channel detector 105 is input into a bit-based de-interleaver (inverse interleaver) 110. The bit-based de-interleaver 110 outputs log likelihood ratios (LLRs) to a soft decision decoder 115, such as an LDPC decoder. The output of the soft decision decoder 115 is input to a bit-based interleaver 130.

Soft decision decoders of bit based error correction codes require the LLRs from the channel detector 105. Similarly, soft decision decoders 220 (described in more detail herein below with respect to FIGS. 2A and 2B) of symbol based codes, including QLDPC codes, require symbol probabilities referred to as a probability mass function (PMF). For example, assuming three-bit symbols (m: symbol size), the PMF of the symbol represents the probabilities of the Q'ary symbol $x_i$ ($i^{th}$ symbol), taking each of the eight (8) possible bit combinations as shown in Equation 1:

$$PMF(x_i)=\{Pr(x_i=f_j); f_j \in GF(q)\}. \quad [\text{Eqn. 1}].$$

Therefore, according to equation 1, for three-bit symbols, $PMF(x_i)$ is a 1×8 vector.

Traditional MAP and SOVA detectors compute the bit LLRs from which it is possible to extract the probabilities of each individual bit. When using a bit based interleaver 110 between the channel detector 105 and soft decision decoder 115 (such as an LDPC decoder), consecutive bits in the decoder domain will be independent. When bits forming a symbol are not correlated, the PMF entries can be computed according to Equation 2 by taking the product of the bit probabilities associated with the particular GF(q) symbol:

$$PMF(x_i) = \left\{ \prod_{k=0}^{m-1} Pr(x_{i\cdot m+k} = f_j^k); f_j \in GF(q = 2^m) \right\}. \quad [\text{Eqn. 2}].$$

In Equation 2, $f_j^k$ represents k'th bit of symbol $f_j$. For example, assuming 2 bit symbols, the PMF for i=0:

$$PMF(x_0) = \begin{pmatrix} Pr([x_0x_1]=[00]) \\ Pr([x_0x_1]=[01]) \\ Pr([x_0x_1]=[10]) \\ Pr([x_0x_1]=[11]) \end{pmatrix} = \begin{pmatrix} Pr(x_0=0)\cdot Pr(x_1=0) \\ Pr(x_0=0)\cdot Pr(x_1=1) \\ Pr(x_0=1)\cdot Pr(x_1=0) \\ Pr(x_0=1)\cdot Pr(x_1=1) \end{pmatrix}. \quad [\text{Eqn. 3}]$$

Although computing the PMF by multiplying the bit probabilities is simple and trivial, it is not optimal and does not lead to very good performance. The problems are as follows:

Consecutive bit errors can result when the channel detector 115 fails. These consecutive errors are usually +−+ . . . error events. That is, for the input sequence of {010} the detector delivers {101}. These type or error events are also called "Nyquist" error events.

The existence of the error events also implies that the bit errors are correlated. Binary codes, however, are unable to take this error event information into account. Furthermore, the LDPC soft decision decoder 115 assumes that the bits participating in a parity check equation are not correlated, which can be achieved by using a combination of parity check matrix design and bit interleaving. Clearly, this approach destroys the error events information.

Conversely, symbol based codes can take into account the error event information in the decoding process. The logical way of using the error event information for symbol based decoding is to pass this information via the PMFs. That is, the symbol probabilities corresponding to error events should have higher probabilities. Assuming GF(8), for the case of a three-bit Nyquist error event, the PMF entries for '010' and '101' should have similar and high probabilities and the remaining PMF entries should have very low probabilities. Therefore, it is important that the method of computing the PMFs should reflect the error event information.

In some example, PMF is computed by multiplying individual bit probabilities. If the detector is not sure about a particular decision or the decision is erroneous, usually the magnitude of the LLR associated with that bit is very close zero, implying that the probabilities of the bit taking the value of '0' or '1' are almost the same. For example, assume the detector includes three consecutive bit errors (such as '010' detected as '101') and associated bit probabilities are {0.51, 0.51, 0.51}. In this example, if the PMF is computed by multiplication for GF(8), the eight PMF entries will be approximately '0.125', implying that all eight GF(8) symbols are equally likely. Therefore, computing the PMFs by multiplying individual bit probabilities destroys the error event information.

As such, a first problem occurs when computing the PMFs from the channel detector in such a way that the error event information is preserved in the PMF. Furthermore, this computation should not increase the complexity of the channel detector and it should not require extensive changes in the existing systems.

The second problem occurs when an iterative detection/decoding system is adapted. For this case, the extrinsic information is exchanged between the detector and the decoder. The solution to the first problem addresses computing the extrinsic PMF information from the channel detector for use in the symbol based ECC decoder that also computes PMFs. Therefore, the second problem is how to use the extrinsic PMF information from the symbol based ECC decoder at the channel detector. The channel detector 105 (such as traditional MAP or SOVA channel detectors) accepts binary extrinsic LLR information. One trivial solution to this problem is to compute the LLR information from PMFs. This approach, however simple, does not deliver very good performance and limits the potential gains of turbo equalization.

Figure 2A:
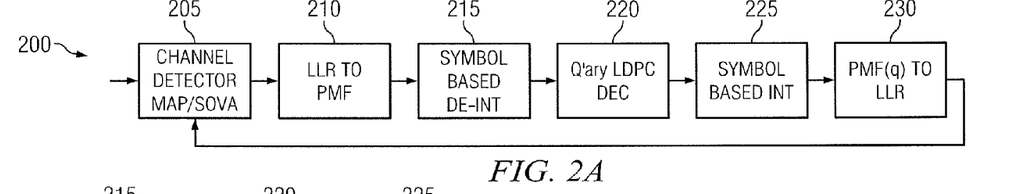
FIGS. 2A through 2B illustrate symbol-based iterative devices according to embodiments of the present disclosure.
Figure 2B:
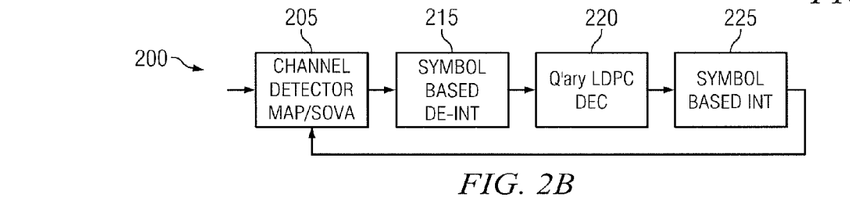

FIGS. 2A through 2B illustrate symbol-based iterative devices according to embodiments of the present disclosure. The embodiments of the symbol-based iterative devices 200 shown in FIGS. 2A and 2B are for illustration only. Other embodiments could be used without departing from the scope of this disclosure.

The symbol-based iterative device 200 can be any symbol based device, such as a Q'ary iterative device. The symbol-based iterative device 200 includes a channel detector 205, such as a MAP or SOVA detector. In some embodiments, channel detector 205 computes LLRs. PMFs are computed from LLRs 210 and computed PMFs optionally interleaved through an inverse symbol interleaver 215 and then fed into the symbol based ECC decoder 220. The decoder computes PMFs and from the symbol interleaved PMFs 225, LLRs are computed 230 for use in the detector as extrinsic a-priori information. In the example illustrated in FIG. 2A, the inverse symbol interleaver 215 is optional. In FIG. 2B, channel detector 205 is configured to produce PMFs. These PMFs are, optionally, inverse interleaved through a symbol based interleaver 210 and passed to the symbol-based decoder 220 as an input. The output PMFs of the symbol-based decoder 220 can be input to a symbol based interleaver 225. Additionally, the output of the symbol based interleaver 215 is used in the channel detector 205 that is configured to use PMF information as the a-priori information as opposed to conventional channel detectors that require LLRs for a-priori information. In FIGS. 2A and 2B, the channel detector 205 and the symbol-based ECC decoder 220 exchanges only extrinsic information.

In some embodiments, the PMF from the symbol-based ECC decoder 220 can be converted back into LLR format for used by the channel detector 205 in the next iteration by PMF-to-LLR conversion 230. In some embodiments, the PMF to LLR conversion block 230 is not included. The PMF to LLR conversion can be avoided if the decoder interleaved PMF entries are combined with branch metric computation at the channel detector 205.

Figure 3:
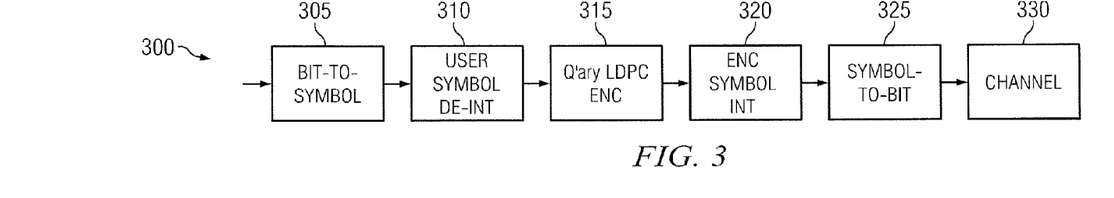
FIG. 3 illustrates a write path according to embodiments of the present disclosure.

FIG. 3 illustrates a write path according to embodiments of the present disclosure. The embodiment shown in FIG. 3 is for illustration only. Other embodiments could be used without departing from the scope of this disclosure.

The write path 300 includes a bit-to-symbol conversion block 305, user symbols de-interleaver block 310, an encoding block 315 (such as a QLDPC encoder), an encoded symbols interleaver block 320, and a symbol-to-bit conversion block 325 coupled to the channel 330.

Referring back to FIG. 2, the channel detector 205 is configured to generate PMF for input into the soft decoder 220. The channel detector 205, such when implemented using a MAP algorithm (hereinafter referred to as MAP detector 205), is configured to perform a PMF computation for MAP or max-log-MAP detector. Given a transmitted sequence of m bits $\underline{u}=[u_1, \ldots, u_m]$ over an ISI channel affected by AWGN noise and a received sequence $\underline{y}=[y_1, \ldots, y_m]$, the MAP detector 205 computes the LLR of bit $u_t$ which is defined according to Equation 4:

$$LLR(u_t) = \log \frac{Pr(u_t = 0 \mid \underline{y})}{Pr(u_t = 1 \mid \underline{y})}. \quad \text{[Eqn. 4]}$$

Given an N state trellis, the probability of a bit conditioned to the received noisy message can be computed by summing the probability over all valid transitions associated with the transitions bit x:

$$Pr(u_t = x) = \sum_{S_{t-1}} \sum_{S_t} Pr(S_{t-1}, S_t \mid \underline{y}, u_t = x) \cdot Pr(S_{t-1}, S_t, u_t = x), \quad \text{[Eqn. 5]}$$

$x \in \{0, 1\}$.

If there is no transition between $S_{t-1}$ and $S_t$ caused by transition bit x, then $P(S_{t-1}, S_t, u_t=x)=0$. If $S_{t-1,t}^x$ is used to represent the set of all valid transitions between $S_{t-1}$ and $S_t$ caused by transition bit x, the above equation can be simplified as Equation 6:

$$Pr(u_t = x) = \frac{1}{Pr(\underline{y})} \sum_{S_{t-1,t}^x} Pr(\underline{y}, S_{t-1,t}^x). \quad \text{[Eqn. 6]}$$

Using the notation illustrated in Equation 7:

$$\underline{y}=(y_1^{t-1}, y_t, y_{t+1}^m) \quad y_1^{t-1}=(y_1, \ldots, y_{t-1}) \quad y_{t+1}^m = (y_{t+1}, \ldots, y_m) \quad \text{[Eqn. 7]};$$

the chain rule of probabilities; and the Markov property of the ISI channel, the join probability can be computed as in Equation 8:

$$Pr(\underline{y}, S_{t-1,t}^x) = Pr(y_1^{t-1}, y_t, y_{t+1}^m, S_{t-1,t}^x) = \quad \text{[Eqn. 8]}$$
$$= Pr(y_1^{t-1}, S_{t-1}) \cdot Pr(y_t, S_t^x \mid y_1^{t-1}, S_{t-1}) \cdot$$
$$Pr(y_{t+1}^m \mid y_1^{t-1}, y_t, S_{t-1}, S_t^x)$$
$$= Pr(y_1^{t-1}, S_{t-1}) \cdot Pr(y_t, S_t^x \mid S_{t-1}^x) \cdot$$
$$Pr(y_{t+1}^m \mid S_t^x).$$

In Equation 8, states $S_{t-1}^x$ and $S_t^x$ represent the beginning and the end states of the transition caused by transition bit $u_t=x$. Additionally, the values $\alpha$, $\beta$ and $\gamma$ are defined by Equations 9A-9C:

$$\alpha_{t-1}(S_{t-1}^x) = Pr(y_1^{t-1}, S_{t-1}^x) \quad \text{[Eqn. 9A]};$$

$$\beta_t(S_t^x) = Pr(y_{t+1}^1 \mid S_t^x) \quad \text{[Eqn. 9B]};$$

$$\gamma_t^x(S_{t-1}^x, S_t^x) = Pr(y_t, S_t^x \mid S_{t-1}^x) \quad \text{[Eqn. 9C]}.$$

Forward variable $\alpha$ and backward variable $\beta$ can be computed recursively using the chain rule of probabilities and the Markov property of the ISI channel as in Equations 10A and 10B:

$$\alpha_t(S_t^x) = \sum_{S_{t-1}^x} \alpha_{t-1}(S_{t-1}^x) \cdot \gamma_t(S_{t-1}^x, S_t^x); \quad \text{[Eqn. 10A]}$$

and $$\beta_t(S_t^x) = \sum_{S_{t+1}^x} \beta_{t+1}(S_{t+1}^x) \cdot \gamma_{t+1}(S_t^x, S_{t+1}^x). \quad \text{[Eqn. 10B]}$$

The well known branch metric $\gamma$ can be computed assuming a Gaussian noise probability density function (pdf). Further, Equations 4, 6, 8 and 9A-9 can be re-written as Equation 11:

$$LLR(u_t) = \log \frac{\sum_{S_{t-1}^0} \sum_{S_t^0} \alpha_{t-1}(S_{t-1}^0) \cdot \gamma_t(S_{t-1}^0, S_t^0) \cdot \beta_t(S_t^0)}{\sum_{S_{t-1}^1} \sum_{S_t^1} \alpha_{t-1}(S_{t-1}^1) \cdot \gamma_t(S_{t-1}^1, S_t^1) \cdot \beta_t(S_t^1)}. \quad \text{[Eqn. 11]}$$

Equation 11 can be further simplified by observing that for a given state $S_{t-1}^x$ and input $u_t=x$, only the state $S_t^x=f(S_{t-1}^x, x)$ can be reached in the trellis. Therefore, Equation 11 can be rewritten by removing the summation over $S_t^x$ as Equation 12:

$$LLR(u_t) = \log \frac{\sum_{S_{t-1}^0} \alpha_{t-1}(S_{t-1}^0) \cdot \gamma_t(S_{t-1}^0, f(S_{t-1}^0, 0)) \cdot \beta_t(S_t^0)}{\sum_{S_{t-1}^1} \alpha_{t-1}(S_{t-1}^1) \cdot \gamma_t(S_{t-1}^1, f(S_{t-1}^1, 1)) \cdot \beta_t(S_t^1)}. \quad [\text{Eqn. 12}]$$

This also is a well known LLR expression of the BCJR (MAP) algorithm in probability domain.

The summation term in the numerator and the denominator of Equation 12, is given by Equation 13:

$$T_{t-1,t}^x = \alpha_{t-1}(S_{t-1}^x) \cdot \gamma_t(S_{t-1}^x, f(S_{t-1}^x, x)) \cdot \beta_t(S_t^x),$$
for $x \in \{0,1\}$ [Eqn. 13].

Equation 13 represents the probability of moving from state $S_{t-1}^x$ to state $S_t^x$ with transition bit x given the received noisy channel output sequence y. For this transition, the branch metric will be $\gamma_t(S_{t-1}^x, f(S_{t-1}^x, 0))$. The transition from state $S_{t-1}^x$ to state $S_t^x$ via transition bit x also represents a data pattern.

Figure 4:
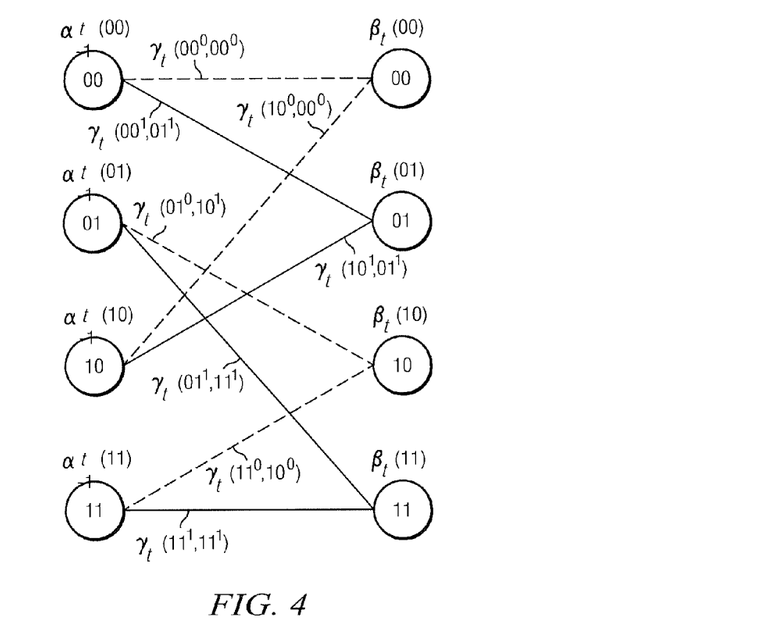
FIG. 4 illustrates a four-state trellis diagram according to embodiments of the present disclosure.

FIG. 4 illustrates a four-state trellis diagram according to embodiments of the present disclosure. The embodiment of the trellis diagram shown in FIG. 4 is for illustration only and other embodiments could be used without departing from the scope of this disclosure.

In the trellis 400, the transitions caused by $u_t=0$ and $u_t=1$ are represented by dashed and solid lines respectively. Furthermore, in the state representation, the right most bit is the most current bit. Some of the different data patterns associated with different transitions are:

Transition from 00 to 00→pattern (t−2,t−1,t)=000
Transition from 11 to 10→pattern (t−2,t−1,t)=110
Transition from 01 to 10→pattern (t−2,t−1,t)=010

It is noted that, if all transitions are considered, all possible 3 bit patterns result.

The trellis 400 is well suited for a full rate implementation, which only processes one trellis stage at a time. For a half rate implementation, two trellis stages are processed at the same time, resulting in four incoming paths for each destination state. This case is illustrated in the trellis diagram shown in FIG. 5.

Figure 5:
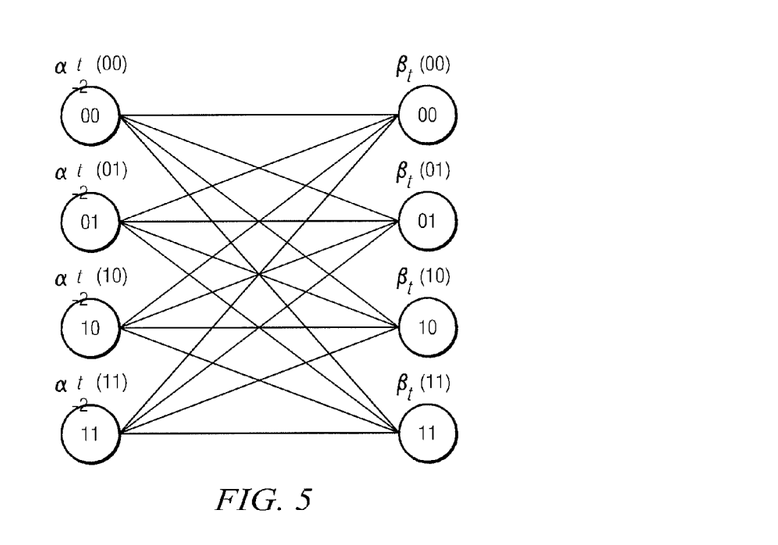
FIG. 5 illustrates a four-state trellis for a half rate detector according to embodiments of the present disclosure.

Each transition corresponds to two trellis stages. Therefore, four incoming paths exist for each destination state. For example, a transition occurs from state '11' to state '00' via state '10' with transition bits '00.' Similarly, the transition from state '00' to state '11' is via state '01' with transition bits '11.'

Figure 6:
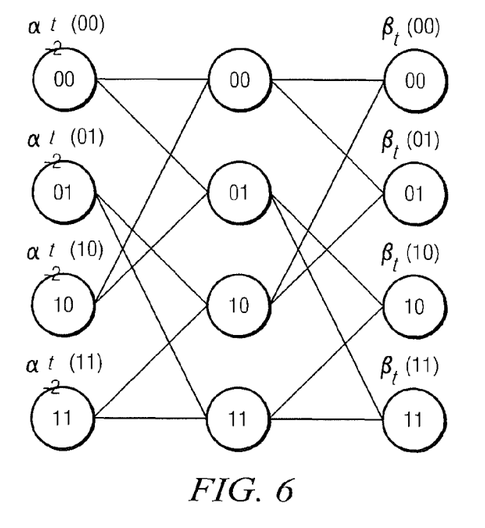
FIG. 6 illustrates two stages of a four-state trellis diagram according to embodiments of the present disclosure.

FIG. 6 illustrates two stages of a four-state trellis diagram according to embodiments of the present disclosure. FIG. 6 shows the two stages of a four state trellis which are merged into a single instance for a half rate detector. Some of the different data patterns associated with different transitions for a 4-state trellis using half rate implementation:

Transition from 11 to 00 via 10→pattern (t−3,t−2, t−1,t)=1100 (transition bits=00)
Transition from 10 to 00 via 00→pattern (t−3,t−2, t−1,t)=1000 (transition bits=00)
Transition from 01 to 10 via 11→pattern (t−3,t−2, t−1,t)=0110 (transition bits=10)

Considering two stages at a time for half rate (½) implementation, the data patterns are four bits. Similarly, for a ⅓ rate implementation, the data patterns associated with three consecutive transitions will be five bits. For quarter rate (¼) implementation, the data patterns will be six bits. Formulating the previously mentioned relation as follows: For $2^n$ state trellis with 1/k rate implementation, the length of the data patterns associated with the transitions will be (n+k) and the transitions cover all possible length (n+k) data patterns.

Since each transition in the trellis 600 represents a data pattern, the MAP detector 205 uses Equation 7 to compute the data pattern probability. Since a single stage of the trellis 600 is involved in creating the transition data pattern, the probability of the data pattern is formed by transitioning from $S_{t-1}$ to $S_t$ with transition bit $u_t=x$ according to Equation 14:

$$Pr(S_{t-1}, S_t, u_t=x) = \alpha_{t-1}(S_{t-1}) \cdot \gamma_t(S_{t-1}, f(S_{t-1}, x)) \cdot \beta_t(S_t),$$
for $x \in \{0,1\}$ [Eqn. 14].

For 1/k rate implementation, since k trellis stages are involved, the probability of data pattern formed by making the transition from state $S_{t-k}$ to $S_t$ with k transition bits $\{u_{t-k+1}, \ldots, u_t\}$ is given Equation 15:

$$Pr(S_{t-k}, S_t, u_{t-k+1}, \ldots, u_t) = \quad [\text{Eqn. 15}]$$

$$\alpha_{t-k}(S_{t-k}) \cdot \left( \prod_{z=0}^{k-1} \gamma_t(S_{t-k+z}, f(S_{t-k+z}, u_{t-k+1+z})) \right) \cdot \beta_t(S_t).$$

At a given time instant t, the PMF entries for m bit symbols give the probabilities for all $2^m$ possible binary combinations. Since the transitions correspond to data patterns, the data pattern probabilities can be used to compute the PMFs. For example, for a four state trellis full rate implementation (k=1), the PMFs for three bit symbols are computed as:

$$PMF(S_{(t-1)/m}) = \begin{cases} PMF(000)_t = Pr([u_{t-2}u_{t-1}u_t] = [000]) \\ PMF(001)_t = Pr([u_{t-2}u_{t-1}u_t] = [001]) \\ PMF(010)_t = Pr([u_{t-2}u_{t-1}u_t] = [010]) \\ PMF(011)_t = Pr([u_{t-2}u_{t-1}u_t] = [011]) \\ PMF(100)_t = Pr([u_{t-2}u_{t-1}u_t] = [100]) \\ PMF(101)_t = Pr([u_{t-2}u_{t-1}u_t] = [101]) \\ PMF(110)_t = Pr([u_{t-2}u_{t-1}u_t] = [110]) \\ PMF(111)_t = Pr([u_{t-2}u_{t-1}u_t] = [111]) \end{cases} \quad [\text{Eqn. 16A}]$$

$$= \begin{cases} \alpha_{t-1}(00) \cdot \gamma_t(00, 00) \cdot \beta_t(00) \\ \alpha_{t-1}(00) \cdot \gamma_t(00, 01) \cdot \beta_t(01) \\ \alpha_{t-1}(01) \cdot \gamma_t(01, 10) \cdot \beta_t(10) \\ \alpha_{t-1}(01) \cdot \gamma_t(01, 11) \cdot \beta_t(11) \\ \alpha_{t-1}(10) \cdot \gamma_t(10, 00) \cdot \beta_t(00) \\ \alpha_{t-1}(10) \cdot \gamma_t(10, 01) \cdot \beta_t(01) \\ \alpha_{t-1}(11) \cdot \gamma_t(11, 10) \cdot \beta_t(10) \\ \alpha_{t-1}(11) \cdot \gamma_t(11, 11) \cdot \beta_t(11) \end{cases}.$$

If the symbol size m is shorter, then the probabilities of all data patterns are added, with the last m bits being the same as the symbol under consideration: For example, for a four state trellis with half rate (k=½) implementation and three bit symbols, the PMFs are computed as follows:

$$PMF(s_{(t-1)/m}) = \begin{Bmatrix} PMF(000)_t \\ PMF(001)_t \\ PMF(010)_t \\ PMF(011)_t \\ PMF(100)_t \\ PMF(101)_t \\ PMF(110)_t \\ PMF(111)_t \end{Bmatrix} =$$

[Eqn. 16B]

$$\begin{Bmatrix} \alpha_{t-2}(00) \cdot \gamma_{t-1}(00,00) \cdot \gamma_t(00,00) \cdot \beta_t(00) + \alpha_{t-2}(10) \cdot \gamma_{t-1}(10,00) \cdot \gamma_t(00,00) \cdot \beta_t(00) \\ \alpha_{t-2}(00) \cdot \gamma_{t-1}(00,00) \cdot \gamma_t(00,01) \cdot \beta_t(01) + \alpha_{t-2}(10) \cdot \gamma_{t-1}(10,00) \cdot \gamma_t(00,01) \cdot \beta_t(01) \\ \alpha_{t-2}(00) \cdot \gamma_{t-1}(00,01) \cdot \gamma_t(01,10) \cdot \beta_t(10) + \alpha_{t-2}(10) \cdot \gamma_{t-1}(10,01) \cdot \gamma_t(01,10) \cdot \beta_t(10) \\ \alpha_{t-2}(00) \cdot \gamma_{t-1}(00,01) \cdot \gamma_t(01,11) \cdot \beta_t(11) + \alpha_{t-2}(10) \cdot \gamma_{t-1}(10,01) \cdot \gamma_t(01,11) \cdot \beta_t(11) \\ \alpha_{t-2}(01) \cdot \gamma_{t-1}(01,10) \cdot \gamma_t(10,00) \cdot \beta_t(00) + \alpha_{t-2}(11) \cdot \gamma_{t-1}(11,10) \cdot \gamma_t(10,00) \cdot \beta_t(00) \\ \alpha_{t-2}(01) \cdot \gamma_{t-1}(01,10) \cdot \gamma_t(10,01) \cdot \beta_t(01) + \alpha_{t-2}(11) \cdot \gamma_{t-1}(11,10) \cdot \gamma_t(10,01) \cdot \beta_t(01) \\ \alpha_{t-2}(01) \cdot \gamma_{t-1}(01,11) \cdot \gamma_t(11,10) \cdot \beta_t(10) + \alpha_{t-2}(11) \cdot \gamma_{t-1}(11,11) \cdot \gamma_t(11,10) \cdot \beta_t(10) \\ \alpha_{t-2}(01) \cdot \gamma_{t-1}(01,11) \cdot \gamma_t(11,11) \cdot \beta_t(11) + \alpha_{t-2}(11) \cdot \gamma_{t-1}(11,11) \cdot \gamma_t(11,11) \cdot \beta_t(11) \end{Bmatrix}.$$

From 1/k rate implementation of a $2^n$ state trellis, the probability of a data pattern of length n+k (corresponding to a single trellis stage of a 1/k rate detector) can be computed starting from time t−n−k+1 ending at time t as follows:

$$Pr(\{g_0, g_1, \ldots, g_{n+k-1}\}_t) = \qquad [\text{Eqn. 17}]$$
$$Pr(u_{t-n-k+1} = g_0, \ldots, u_{t-1} = g_{n+k-1})$$

$$PMF(f_1 = \{g_0, g_1, \ldots, g_{m-1}\}_t) \qquad [\text{Eqn. 19}]$$
$$= \sum_{u_0} \cdots \sum_{u_{n+k-m-1}} Pr(\{u_0, \ldots, u_{n+k-m-1}, u_{n+k-m}$$
$$= g_0, \ldots, u_{m-1}$$
$$= g_{m-1}\}_t).$$

Table 1 shows a list of supported PMF symbol sizes and the frequency of PMF computation for different detector sizes and implementation rates.

| | Supported PMF symbol size: m = k · x for x = 0, 1, . . . PMF computation frequency: m/k | | | |
|---|---|---|---|---|
| Number of states | Full rate | Half rate (½) | ⅓ rate | Quarter rate (¼) |
| 4 | 1, 2, 3, 4, 5 . . . | 2, 4, 6, 8, . . . | 3, 6, 9 . . . | 4, 8, . . . |
| 8 | 1, 2, 3, 4, 5 . . . | 2, 4, 6, 8, . . . | 3, 6, 9 . . . | 4, 8, . . . |
| 16 | 1, 2, 3, 4, 5 . . . | 2, 4, 6, 8, . . . | 3, 6, 9 . . . | 4, 8, . . . |
| 32 | 1, 2, 3, 4, 5, 6 . . . | 2, 4, 6, 8, . . . | 3, 6, 9 . . . | 4, 8, . . . |
| PMF Computation Frequency → | Every mth stage | m = 2→ m/k = 1 m = 4→m/k = 2 m = 6→m/k = 3 | m = 3→ m/k = 1 m = 6→m/k = 2 m = 9→m/k = 3 | m = 4→ m/k = 1 m = 8→ m/k = 2 m = 12→m/k = 3 |

-continued
$$Pr(\{g_0, g_1, \ldots, g_{n+k-1}\}_t) = \alpha_{t-k}(S_{t-k}^{g_{n+1}}) \cdot$$
$$\left( \prod_{z=0}^{k-1} \gamma_t(S_{t-k+z}^{g_{n+1+z}}, f(S_{t-k+z}^{g_{n+1+z}}, g_{n+1+z})) \right) \cdot \beta_t(S_t^{g_{n+k-1}}).$$

If n+k=m, then for (t−1)/m$^{th}$ symbol's PMF entry of GF element $f_1$ is according to Equation 18:

PMF($f_1$={$g_0,g_1,\ldots,g_{m-1}$}$_t$)=Pr({$u_0$=$g_0,u_1$=$g_1,\ldots,$
$u_{n+k-1}$=$g_{n+k-1}$}$_t$)  [Eqn. 18].

If the symbol size m<n+k, the PMF can be computed by adding the probabilities of all data patterns with the last m bits the same as the symbol under consideration:

Supported symbol sizes, denoted bold in Table 1, utilize a single trellis stage of the 1/k rate detector (corresponding to a data pattern of size n+k). For half, third, quarter and higher rate implementations of the detector, symbol sizes that are not multiples of k can be supported as well, provided that the intermediate branch values are stored for processing. That is, for a 1/k rate detector, the transition probabilities corresponding to each of the k transitions are stored. These values are then used to compute the intermediate forward and backward variables which are utilized for PMF computation.

Further, for a symbol size of m, the PMF shows the probabilities of m consecutive bits that make up the symbol. For example, assuming m=3, then $PMF_0$ shows the joint probabilities of bits (0,1,2), $PMF_1$ shows the joint probability of bits (3,4,5).

A one bit transition from one state to the next corresponds to data patterns of length (n+k)=(n+1).

"s" trellis stages of a 1/k rate $2^n$ state detector correspond to a data pattern of (n+k.s) because each trellis stage corresponds to k transition bits and states are represented by n bits.

A 1/k rate $2^n$ state detector stages include a granularity of k bits, that is, k bits per transition.

The different rate detectors for supported symbol sizes and PMF computation frequency are:

Full rate detector: For this case, the MAP detector 205 considers one transition at a time, that is, transitions from state $S_{t-1}$ to $S_t$ with transition bit $u_t$:

$$\ldots S_{t-1} \xrightarrow{u_t} S_t \xrightarrow{u_{t+1}} S_{t+1} \xrightarrow{u_{t+2}} S_{t+2} \ldots$$

As a result, PMF computation is done at every m-th trellis stage. For instance, if m=2, then $PMF_0 = Pr[u_0 u_1]$ at t=2 which corresponds to two transition bits $u_0 u_1$. Similarly, $PMF_1 = Pr[u_2 u_3]$ at t=4 which corresponds to two transition bits $u_2 u_3$.

Half rate detector: for this case, the MAP detector 205 considers two transitions at a time, that is, transitions from state $S_{t-2}$ to $S_t$ with transition bits $u_{t-1} u_{t-2}$:

$$\ldots S_{t-2} \xrightarrow{u_{t-1} u_t} S_t \xrightarrow{u_{t+1} u_{t+2}} S_{t+2} \xrightarrow{u_{t+3} u_{t+4}} S_{t+4} \ldots$$

In this example, symbol sizes that are multiple of k are supported since the first trellis stage corresponds to transition bits {0,1}, second trellis stage corresponds to bits {2,3} and third trellis stage corresponds to bits {4,5} and i-th trellis stage corresponds to bits {2*i,2*i+1}. Accordingly, the trellis includes steps of two (2). Therefore, a half rate detector only supports symbol sizes that are multiple of two (2).

For example, let's consider m=8 for half rate eight state trellis. For this case, $PMF_k$ represents probability of the symbol made of bits {k−7, k−6, ..., k}. Similarly, the next PMF represents probability of symbols made of bits {k+1, k+2, ... k+8}. The data patterns for different number of trellis stages are as follows:

Single trellis stage data pattern is for five (5) bits {0,1,2,3,4}.

Two (2) trellis stages' data pattern is for seven (7) bits {0,1, ... ,5,6}.

Three (3) trellis stages' data pattern is for nine (9) bits {0,1, ... ,7,8}

To cover the required eight (8) bit symbol size, a three half rate trellis stages is utilized, which correspond to a data pattern size of 3+2*3=9 bits. Therefore, if first PMF is computed from the $3^{rd}$ trellis stage, the next PMF computation will occur m/k=8/2=4 half rate stages later, that is, at 3+4=$7^{th}$ half rate trellis stage.

⅓ rate and ¼ rate detectors: for these cases, the same arguments given for half rate detector apply.

For a $2^n$ state trellis with 1/k rate implementation, the results in Table 1 can be summarized as follows:

Supported symbol sizes: m=k.x for x=0, 1, ...

PMF computation frequency: m/k

Any supported symbol size that is greater than n+k requires PMF computation involving more than one 1/k rate trellis stages. Therefore, the transition probabilities are stored for all required stages. Supported symbol sizes: m=k.x for m<n+k and x=0, 1, ... (Shown bold in Table 1).

In some embodiments, the MAP detector 205 is implemented in the log domain. This transforms the multiplications of all probability terms into additions of the logarithms of the probabilities and the Equation 17 becomes:

$$\log(Pr(\{g_0, g_1, \ldots, g_{n+k-1}\})_t) = \log(\alpha_{t-k}(S_{t-k}^{g_n+1})) + \left(\sum_{z=0}^{k-1} \log(\gamma_t(S_{t-k+z}^{g_{n+1+z}}, f(S_{t-k+z}^{g_{n+1+z}}, g_{n+1+z})))\right) + \log(\beta_t(S_t^{g_{n+k-1}})).$$ [Eqn. 20]

As mentioned earlier, if the symbol size m is shorter than n+k, the PMF is computed by adding the probabilities of all data patterns with the last m bits being the same as the symbol under consideration (such as in Equation 19). For log domain implementation of Equation 19, a Jacobian approximation can be used for the summation of the probabilities:

$$\log(p_1+p_2) = \max(\log(p_1), \log(p_2))$$ [Eqn. 21].

This is the same approximation used for max-log-MAP process and this simplification does not cause significant performance degradation. If an exact answer is sought for the logarithm of the PMF given by Equation 19, then a correction term indexed by $\log(p_1)-\log(p_2)$ is added to Equation 21, which can be costly to implement.

Following Jacobian approximation, Equation 17 becomes Equation 22:

$$\log(PMF(f_1 = \{g_0, g_1, \ldots, g_{m-1}\}_t)) = \max\left\{\log\left(Pr\left(\begin{cases} u_0, \ldots, u_{n+k-m-1}, u_{n+k-m} = \\ g_0, \ldots, u_{m-1} = g_{m-1} \end{cases}\right)_t\right)\right\}.$$ [Eqn. 22]

In Equation 22, the maximization is done over all combinations of $u_0, \ldots, u_{n+k-m-1}$. Since the symbol based ECC decoder 220 is usually implemented in log domain, log(P-MFs) are used, which are computed using Equation 22.

In channel detector 105 (e.g., when a MAP detector), the extrinsic LLR information is used in the branch metric computation $\gamma_t^x(S_{t-1}^x, S_t^x)$. The branch metric represents the probability of moving from state $S_{t-1}^x$ and to state $S_t^x$ with transition bit x given the received noisy channel output sequence y. If a-priori information about transition bit x exists, this extrinsic information can be used in the branch metric computation as illustrated in Equation 23:

$$\gamma_t^x(S_{t-1}^x, S_t^x) = Pr(y_t, S_t^x | S_{t-1}^x) \cdot Pr(u_t = x)$$ [Eqn. 23].

If there is no a-priori information about the transition bit, then the multiplication in Equation 23 is not necessary. For the case of turbo equalization, the channel detector 105 and ECC decoder 115 exchange soft information which leads to significant performance improvement. If the ECC 100 is bit based then the ECC decoder 115 computes LLRs, which are directly useable by the detector 105. However, for the case of symbol based ECC 200, the soft decoder 220 computes PMFs. LLRs can be computed from the PMFs, such as in the PMF-to-LLR conversion block 230. Thereafter, the LLRs can be used in the MAP detector 205. However, this approach can decrease the potential turbo equalization gains significantly.

In some embodiments, the MAP detector 205 is configured to utilize ePMF (e.g., extrinsic PMF). The MAP detector 205 can use the ePMF information from the symbol based ECC decoder 220 without computing the LLRs.

The forward and backward variable computations for use by the MAP detector 205 in order to utilize the ePMFs directly are as follows:

Forward variable in a conventional 1/k rate MAP detector is computed according to Equation 24:

$$\alpha_t(S_t^{x=[x_0 x_1 \cdots x_{k-1}]}) = \sum_{S_{t-k}^{x=[x_0 x_1 \cdots x_{k-1}]}} \alpha_{t-k}(S_{t-k}^{x_0}) \cdot \left(\prod_{z=0}^{k-1} \gamma_t(S_{t-k+z}^{x_z}, f(S_{t-k+z}^{x_z}, x_z))\right). \quad \text{[Eqn. 24]}$$

For full rate implementation (k=1), Equation 16 simplifies to:

$$\alpha_t(S_t^x) = \sum_{S_{t-1}^x} \alpha_{t-1}(S_{t-1}^x) \cdot \gamma_t(S_{t-1}^x, S_t^x). \quad \text{[Eqn. 25]}$$

In Equations 24 or 25, the extrinsic LLR information is incorporated into transition probability computation shown in Equation 22. For the case of max-log-map, the multiplications in Equations 24 and 25 become additions and the summation is replaced by a max operation.

Furthermore, all paths leading to the destination state in forward variable computation share exact same transition bits. For 1/k rate implementation, the transitions are caused by k transition bits. For example, for a half rate four state trellis, as illustrated in FIG. 5, from all four states with transition bits '00,' a transition is made to state '00.' Similarly, from all four states with transition bits '11,' a transition is made to state '11.'

Additionally, since all transitions ending at a destination state have the same transition bits, in Equation 24, the forward variable can be computed without taking a-priori information into account in the γ (transition probability) computation. This binary a-priori information can be included to the computed forward variable as according to Equations 26 and 27:

$$Pr([u_{t-k+1} \cdots u_t] = [x_0 \cdots x_{k-1}]) = \left(\prod_{z=0}^{k-1} Pr(u_{t-z} = x_{k-1-z})\right). \quad \text{[Eqn. 26]}$$

$$\alpha_t(S_t^{x=[x_0 x_1 \cdots x_{k-1}]}) = \left[\sum_{S_t^{x=[x_0 x_1 \cdots x_{k-1}]}} \alpha_{t-k}(S_{t-k}^{x_0}) \cdot \left(\prod_{z=0}^{k-1} \gamma_t(S_{t-k+z}^{x_z}, f(S_{t-k+z}^{x_z}, x_z))\right)\right] \cdot Pr\left(\begin{array}{c}[u_{t-k+1} \cdots u_t] = \\ [x_0 \cdots x_{k-1}]\end{array}\right). \quad \text{[Eqn. 27]}$$

Equation 26 computes the probability of the k-bit transition sequence. Since PMF represents m bit symbol probability, for k=m the PMF can be used in Equation 27 directly as illustrated in Equation 28:

$$\alpha_t(S_t^{x=[x_0 x_1 \cdots x_{k-1}]}) = \left[\sum_{S_t^{x=[x_0 x_1 \cdots x_{k-1}]}} \alpha_{t-k}(S_{t-k}^{x_0}) \cdot \left(\prod_{z=0}^{k-1} \gamma_t(S_{t-k+z}^{x_z}, f(S_{t-k+z}^{x_z}, x_z))\right)\right] \cdot PMF(x_0 x_1 \cdots x_{k-1})_t. \quad \text{[Eqn. 28]}$$

For example, when the MAP detector 205 is a half rate (i.e., k=2), four state detector and the decoder 220 is a two bit symbol based ECC (i.e., m=2, GF(2)), the forward variable can be computed according to Equations 29A-29D:

$$\alpha_t(00) = \begin{pmatrix} \alpha_{t-2}(00) \cdot \gamma_{t-1}(00, 00) \cdot \gamma_t(00, 00) + \alpha_{t-2}(01) \cdot \\ \gamma_{t-1}(01, 10) \cdot \gamma_t(10, 00) + \alpha_{t-2}(10) \cdot \gamma_{t-1}(10, 00) \cdot \\ \gamma_t(00, 00) + \alpha_{t-2}(11) \cdot \gamma_{t-1}(11, 10) \cdot \gamma_t(10, 00) \end{pmatrix} \cdot PMF(00)_t. \quad \text{[Eqn. 29A]}$$

$$\alpha_t(01) = \begin{pmatrix} \alpha_{t-2}(00) \cdot \gamma_{t-1}(00, 00) \cdot \gamma_t(00, 01) + \alpha_{t-2}(01) \cdot \\ \gamma_{t-1}(01, 10) \cdot \gamma_t(10, 01) + \alpha_{t-2}(10) \cdot \gamma_{t-1}(10, 00) \cdot \\ \gamma_t(00, 01) + \alpha_{t-2}(11) \cdot \gamma_{t-1}(11, 10) \cdot \gamma_t(10, 01) \end{pmatrix} \cdot PMF(01)_t. \quad \text{[Eqn. 29B]}$$

$$\alpha_t(10) = \begin{pmatrix} \alpha_{t-2}(00) \cdot \gamma_{t-1}(00, 01) \cdot \gamma_t(01, 10) + \alpha_{t-2}(01) \cdot \\ \gamma_{t-1}(01, 11) \cdot \gamma_t(11, 01) + \alpha_{t-2}(10) \cdot \gamma_{t-1}(10, 01) \cdot \\ \gamma_t(01, 10) + \alpha_{t-2}(11) \cdot \gamma_{t-1}(11, 11) \cdot \gamma_t(10, 10) \end{pmatrix} \cdot PMF(10)_t. \quad \text{[Eqn. 29C]}$$

$$\alpha_t(11) = \begin{pmatrix} \alpha_{t-2}(00) \cdot \gamma_{t-1}(00, 01) \cdot \gamma_t(01, 11) + \alpha_{t-2}(01) \cdot \\ \gamma_{t-1}(01, 11) \cdot \gamma_t(11, 11) + \alpha_{t-2}(10) \cdot \gamma_{t-1}(10, 01) \cdot \\ \gamma_t(01, 11) + \alpha_{t-2}(11) \cdot \gamma_{t-1}(11, 11) \cdot \gamma_t(11, 11) \end{pmatrix} \cdot PMF(11)_t. \quad \text{[Eqn. 29D]}$$

For max-log-map algorithm, the multiplications in the above example become additions and the summation term before PMF multiplication is replaced by a max operation.

Therefore, for $GF(2^m)$ ECC code and a 1/k rate MAP detector 205, the extrinsic PMF from the ECC decoder 220 is easily used for the forward variable computation of the MAP detector 205 by simply multiplying the computed forward variable with a relevant PMF entry.

In Table 2, for different rate and state detectors, the supported PMF symbol sizes are shown. A 1/k rate MAP detector 205 covers symbol sizes that are multiples of k. The MAP detector 205 can multiply the computed forward variable with a relevant PMF entry.

For example, with a half rate eight state trellis and a symbol size of m=8, the $PMF_k$ represents probability of the symbol made of bits {k−7,k−6, . . . ,k}. Similarly the next PMF represents probability of symbols made of bits {k+1,k+2, . . . k+8}. Therefore, when computing the first PMF from the 3$^{rd}$ trellis stage, the next PMF computation will be performed (m/k)=(8/2)=4 half rate stages later, that is, at a 3+4=7th half rate trellis stage.

In another example, the MAP detector 205 is a quarter rate detector including only two bit symbols. Each trellis stage corresponds to four transition bits. The computed forward variable is multiplied with the probability of the four bit transition sequence. Since two bit symbols are included, the transition sequence probability is computed by multiplying two appropriate PMFs as illustrated in Equations 30A and 30B:

$$Pr(x_0=1, x_1=0, x_2=1, x_3=1) = PMF(1011)_0 \quad \text{[Eqn. 30A]}.$$

$$Pr(x_0=1, x_1=0, x_2=1, x_3=1) = PMF(10)_0 \cdot PMF(11)_0 \quad \text{[Eqn. 30B]}.$$

For supported symbol sizes in Table 2 that are smaller than the number of transition bits per trellis stage (k), the transition bit sequence probability is computed by multiplying k/m appropriate PMF values.

TABLE 2

Supported PMF symbol sizes for using extrinsic PMF in forward variable computation.
Supported PMF symbol sizes, m = k · x for x = 0, 1, . . .
PMF computation frequency: max (1, m/k)

| Number of states | Full rate k = 1 | Half rate (½) k = 2 | ⅓ rate k = 3 | Quarter rate (¼) k = 4 |
|---|---|---|---|---|
| 4 | 1, 2, 3, 4, 5 . . . | 1, 2, 4, 6, . . . | 1, 3, 6, . . . | 1, 2, 4, 8, . . . |
| 8 | 1, 2, 3, 4, 5 . . . | 1, 2, 4, 6, . . . | 1, 3, 6, . . . | 1, 2, 4, 8, . . . |
| 16 | 1, 2, 3, 4, 5 . . . | 1, 2, 4, 6, . . . | 1, 3, 6, . . . | 1, 2, 4, 8, . . . |
| 32 | 1, 2, 3, 4, 5, 6 . . . | 1, 2, 4, 6, . . . | 1, 3, 6, . . . | 1, 2, 4, 8, . . . |
| Computation Frequency → | Every mth stage | m = 1→ 1 m = 2→ m/k = 1 m = 4→m/k = 2 m = 6→m/k = 3 | m = 1→ 1 m = 3→ m/k = 1 m = 6→m/k = 2 m = 9→m/k = 3 | m = 1→ 1 m = 2→ 1 m = 4→ m/k = 1 m = 8→ m/k = 2 |

In Table 2, the supported symbol sizes, denoted bold, utilize single trellis stages of the MAP detector 205.

The MAP detector 205 also can perform backward variable computation with ePMF Information. The MAP detector 205 can compute the backward variable according to Equation 31:

$$\beta_t(S_t^{x=[x_0 x_1 \cdots x_{k-1}]}) = \sum_{S_t^{x=[x_0 x_1 \cdots x_{k-1}]}} \beta_{t+k}(S_{t+k}^{x_k-1}) \cdot \left( \prod_{z=0}^{k-1} \gamma_t(S_{t+k+z}^{x_{k-1-z}}, f(S_{t+k+z}^{x_{k-1-z}}, x_{k-1-z})) \right).$$ [Eqn. 31]

For full rate implementation (k=1), Equation 31 simplifies to Equation 32:

$$\beta_t(S_t^x) = \sum_{S_{t+1}^x} \beta_{t+1}(S_{t+1}^x) \cdot \gamma_{t+1}(S_t^x, S_{t+1}^x).$$ [Eqn. 32]

In Equations 31 or 32, the extrinsic LLR information is incorporated into transition probability computation shown in Equation 23. For max-log-map detector, the multiplications in Equations 31 and 32 become additions and the summation is replaced by a max operation.

Figure 7:
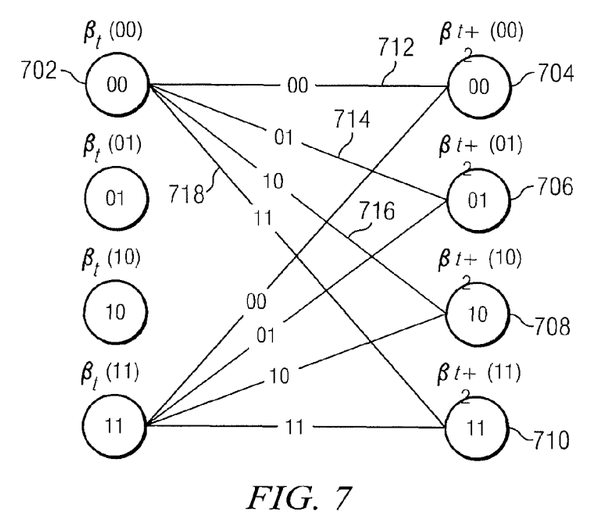
FIG. 7 illustrates a half rate four state detector trellis according to embodiments of the present disclosure.

When the MAP detector 205 is configured to use ePMF information, the forward variable computation approach is not used for backward variable computation because all paths merging in the destination state for backward variable computation have different transition bits. For example in a ½ rate 4 state trellis, as illustrated in FIG. 7, at state '00' 702 at time instant t, four incoming paths exist, originating from states '00' 704, '01' 706, '10' 708 and '11' 710 at time instant t+2. The transition bits are '00' 712, '01' 714, '10' 716 and '11' 718 respectively.

The MAP detector 205 utilizes ePMF in backward variable computation by multiplying the transition probability of each path ending at a destination state with an appropriate PMF value. For symbol size of m and detector implementation rate of k, if m=k.x (x=1, 2, 3, . . . ), x trellis stages are evaluated at a time and the combined transition probability is multiplied with the appropriate PMF entry.

For example, assuming m=6, k=½ and n=3, with transition bits '011001' cause a transition from a state '000' to state '001' via states '001' and '110' after 3 half rate transitions. For this transition sequence, one of the summation terms in Equation 31 (corresponding to one of the possible paths ending at state '000') will be:

$$\gamma_t(000,001)^{01} \cdot \gamma_{t+2}(001,110)^{10} \cdot \gamma_{t+4}(110,001)^{01} \cdot \beta_{t+4}(001).$$

Above, the superscripts denote the transition bits and each transition probability is also a multiplication of two full rate trellis stage probabilities as illustrated in Equation 33:

$$\gamma_t(000,001)^{01} = \gamma_t(000,000)^0 \cdot \gamma_{t+1}(000,001)^1$$ [Eqn. 33].

In this example, the PMF is included into backward variable computation as follows:

$$\gamma_t(000,001)^{01} \cdot \gamma_{t+2}(001,110)^{10} \cdot \gamma_{t+4}(110,001)^{01} \cdot \beta_{t+4}(001) \cdot PMF(011001)_{t+4}$$

This approach can be generalized according to Equation 34:

$$\beta_t(S_t^{x=[x_0 x_1 \cdots x_{k-1}]}) = \sum_{S_t^{x=[x_0 x_1 \cdots x_{k-1}]}} \beta_{t+k}(S_{t+k}^{x_k-1}) \cdot PMF(x_{k-m} \cdots x_{k-1})_{t+k} \cdot \left( \prod_{z=0}^{k-1} \gamma_t(S_{t+k+z}^{x_{k-1-z}}, f(S_{t+k+z}^{x_{k-1-z}}, x_{k-1-z})) \right).$$ [Eqn. 34]

In one illustrative example, the MAP detector 205 is a 1/k rate $2^n$ state detector for m bit symbols. The MAP detector 205 is configured to use the ePMF information in a backward variable computation, where m=k and n=m. For example, first the backward variables at time t+k are updated according to Equation 35:

$$\beta_{t+k}(S_{t+k}=[x_0 x_1 \ldots x_{n-1}]) = \beta_{t+k}(S_{t+k}=[x_0 x_1 \ldots x_{n-1}]) \cdot PMF_{t+k}([x_0 x_1 \ldots x_{k-1}])$$ [Eqn. 35].

The backward variable is then computed according to Equation 31.

When the MAP detector 205 is a half rate (k=2) rate, four state detector and the soft decoder 215 is a two bit symbol based ECC (i.e., m=2, GF(4)), the backward variable is computed as according to Equations 36A-36D:

$$\beta_t(00) = \quad \text{[Eqn. 36A]}$$
$$\begin{pmatrix} \beta_{t+2}(00) \cdot PMF_{t+2}(00) \cdot \gamma_{t+1}(00, 00) \cdot \gamma_{t+2}(00, 00) + \\ \beta_{t+2}(01) \cdot PMF_{t+2}(01) \cdot \gamma_{t+1}(00, 00) \cdot \gamma_{t+2}(00, 01) + \\ \beta_{t+2}(10) \cdot PMF_{t+2}(10) \cdot \gamma_{t+1}(00, 01) \cdot \gamma_{t+2}(01, 10) + \\ \beta_{t+2}(11) \cdot PMF_{t+2}(11) \cdot \gamma_{t+1}(00, 01) \cdot \gamma_{t+2}(01, 11) \end{pmatrix}.$$

$$\beta_t(01) = \quad \text{[Eqn. 36B]}$$
$$\begin{pmatrix} \beta_{t+2}(00) \cdot PMF_{t+2}(00) \cdot \gamma_{t+1}(01, 10) \cdot \gamma_{t+2}(10, 00) + \\ \beta_{t+2}(01) \cdot PMF_{t+2}(01) \cdot \gamma_{t+1}(01, 10) \cdot \gamma_{t+2}(10, 01) + \\ \beta_{t+2}(10) \cdot PMF_{t+2}(10) \cdot \gamma_{t+1}(01, 11) \cdot \gamma_{t+2}(11, 10) + \\ \beta_{t+2}(11) \cdot PMF_{t+2}(11) \cdot \gamma_{t+1}(01, 11) \cdot \gamma_{t+2}(11, 11) \end{pmatrix}.$$

$$\beta_t(10) = \quad \text{[Eqn. 36C]}$$
$$\begin{pmatrix} \beta_{t+2}(00) \cdot PMF_{t+2}(00) \cdot \gamma_{t+1}(10, 00) \cdot \gamma_{t+2}(00, 00) + \\ \beta_{t+2}(01) \cdot PMF_{t+2}(01) \cdot \gamma_{t+1}(10, 00) \cdot \gamma_{t+2}(00, 01) + \\ \beta_{t+2}(10) \cdot PMF_{t+2}(10) \cdot \gamma_{t+1}(10, 01) \cdot \gamma_{t+2}(01, 10) + \\ \beta_{t+2}(11) \cdot PMF_{t+2}(11) \cdot \gamma_{t+1}(10, 01) \cdot \gamma_{t+2}(01, 11) \end{pmatrix}.$$

$$\beta_t(11) = \quad \text{[Eqn. 36D]}$$
$$\begin{pmatrix} \beta_{t+2}(00) \cdot PMF_{t+2}(00) \cdot \gamma_{t+1}(11, 10) \cdot \gamma_{t+2}(10, 00) + \\ \beta_{t+2}(01) \cdot PMF_{t+2}(01) \cdot \gamma_{t+1}(11, 10) \cdot \gamma_{t+2}(10, 01) + \\ \beta_{t+2}(10) \cdot PMF_{t+2}(10) \cdot \gamma_{t+1}(11, 11) \cdot \gamma_{t+2}(11, 10) + \\ \beta_{t+2}(11) \cdot PMF_{t+2}(11) \cdot \gamma_{t+1}(11, 11) \cdot \gamma_{t+2}(11, 11) \end{pmatrix}.$$

In this example, Equation 34 is repeated at every 1/k rate trellis stage, i.e., m/k frequency shown in the previous stages is valid for backward variable computation as well.

In some embodiments, the channel detector 205 is a SOVA detector (hereinafter referred to as SOVA detector 205). SOVA detector 205 can be used as the channel detector for ISI channels. SOVA detector 205 can perform the same processes as discussed for MAP detector 205 to generate PMF and use extrinsic PMF (ePMF).

Figures 8, 9A:
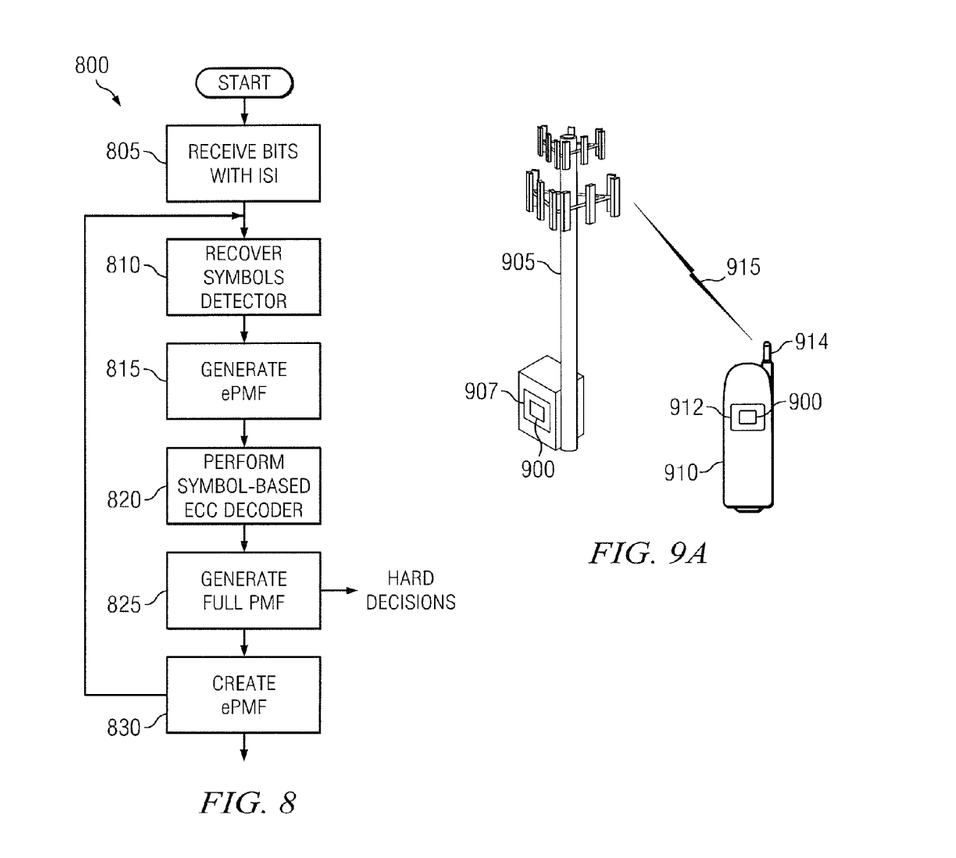
FIG. 8 illustrates a process for error correction coding according to embodiments of the present disclosure.
FIGS. 9A through 9B illustrate devices capable of error correction decoding according to embodiments of the present disclosure.

FIG. 8 illustrates a process for error correction coding according to embodiments of the present disclosure. The embodiment of the process 800 shown in FIG. 8 is for illustration only. Other embodiments could be used without departing from the scope of this disclosure.

In block 805, the channel detector 205 receives a stream of bits with inter-symbol-interference. The channel detector 205 commences an operation to recover the bits in block 810. The channel detector 205 generates extrinsic PMF information in block 815. This PMF information is input to the symbol-based decoder 220, such as a Q'ary LDPC. In block 820, the symbol-based decoder 215 performs an error correction code operation based on the extrinsic PMF information from the channel detector 205. The symbol-based decoder 220 generates and outputs full PMF information in block 825. The full PMF information is used to make hard decisions. Additionally, in block 830, the symbol-based decoder 220 generates extrinsic PMF information to be delivered to the channel detector 205 for the next iteration in a turbo equalization process. The extrinsic PMF information is generated by removing the extrinsic PMF information input to the symbol-based ECC decoder 220 from the full PMF computed by the symbol-based ECC decoder 220.

Figure 9B:
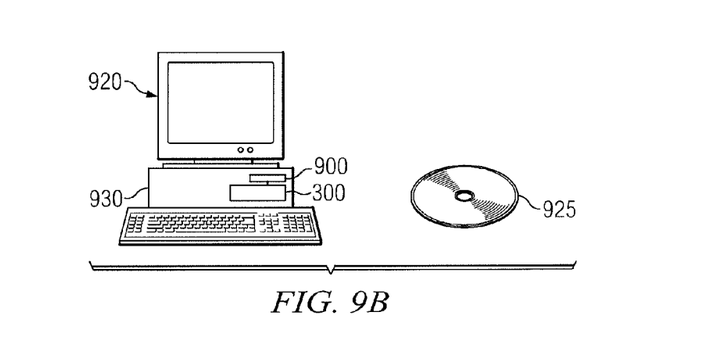

FIGS. 9A through 9B illustrate devices capable of error correction decoding according to embodiments of the present disclosure. The embodiments of the devices shown in FIGS. 9A through 9B is for illustration only. Other embodiments could be used without departing from the scope of this disclosure.

The symbol based ECC device 900 can include the same structure and functionality as the symbol-based iterative device 200, illustrated in FIG. 2. The symbol based ECC device 900 can include a channel detector and symbol-based decoder (not specifically illustrated in FIGS. 9A and 9B). One or more types of devices or systems can include the symbol based ECC device 900. Additionally, one or more components in the symbol based ECC device 900 can be located in separate controllers within an apparatus or system. In some embodiments, the symbol based ECC device 900 includes the write path 300. In some embodiments, the write path is disposed in a controller separate from the symbol based ECC device 900.

In some embodiments, a symbol based ECC device 900 can be included in a transceiver or receiver of a base station 905 and a transceiver or receiver mobile station 910. The base station 905 and mobile station 910 each transmit and receive communications via a wireless communication channel. For example, the base station 905 can include a transceiver 907 that includes symbol-based ECC device 900. The symbol-based ECC device 900 further includes write path 300 (not specifically illustrated) to encode communications for the mobile stations 910. The base station 905 transmits the encoded communications to the mobile station 910. The mobile station can include a receiver 912 coupled to an antenna 914. The receiver 912 can include the symbol based ECC device 900. The mobile station 910 can receive the communications from the base station 905 over the wireless communication channel 915. The symbol based ECC device 900 recovers the ISI symbols and performs symbol-based soft decision decoding.

Additionally, the symbol based ECC 900 can be included in a computer 920 that reads data from a magnetic communication medium 925. The computer 920 includes a magnetic drive apparatus 930. The magnetic drive apparatus 930 includes the symbol-based iterative device 900 and the write path 300. In some embodiments, the symbol-based iterative device 900 and the write path 300 are disposed in separate components (not illustrated) within the computer 920. The magnetic drive apparatus 930 is configured to read data from the magnetic communication medium 925. The magnetic drive apparatus 930 recovers the symbols and performs symbol-based soft decision decoding. In some embodiments, the magnetic drive apparatus 930 can write data to the magnetic communication medium 925.

In some embodiments, the communication medium 925 is an optical communication medium. In such embodiments, the computer 920 includes an ECC device 900 configured to recover symbols from an optic channel. Additionally, embodiments using different communication channels could be used without departing from the scope of this disclosure.

Although the present disclosure has been described with an exemplary embodiment, various changes and modifications may be suggested to one skilled in the art. It is intended that the present disclosure encompass such changes and modifications as fall within the scope of the appended claims.

What is claimed is:
1. A system for decoding data, the system comprising:
 a symbol based error correction code magnetic drive device, the error correction code magnetic drive device comprising:
  a channel detector configured to recover inter-symbol interference (ISI) channel inputs for bits received by the error correction code magnetic drive device and to generate first extrinsic probability mass function (PMF) information; and a symbol-based decoder coupled to the channel detector and configured to receive the first extrinsic PMF information from the channel detector, the decoder configured to use the first extrinsic PMF information to perform an error correction code operation on symbols recovered from the received bits, and wherein the decoder is configured to generate full PMF information using the first extrinsic PMF information and to generate second extrinsic PMF information for use by the channel detector.

2. The system as set forth in claim 1, wherein the channel detector is one of:

a maximum-a-posteriori (MAP) detector; and a max-log-MAP.

3. The system as set forth in claim 1, wherein the channel detector is a soft output Viterbi algorithm (SOVA) detector.

4. The system as set forth in claim 1, wherein the decoder is configured to create the second extrinsic PMF information by removing input of the first extrinsic PMF information from the full PMF computed by the decoder.

5. The system as set forth in claim 1, wherein the channel detector is configured to receive the second extrinsic PMF information from the decoder and to use the second extrinsic PMF information in a turbo equalization operation.

6. The system as set forth in claim 1, further comprising a symbol-based interleaver coupled to an output of the decoder, the symbol-based interleaver configured to interleave the PMF information.

7. The system as set forth in claim 1, further comprising a symbol based inverse interleaver coupled to the output of the channel detector, the symbol based inverse interleaver configured to interleave the first extrinsic PMF information generated by the channel detector.

8. The system as set forth in claim 1, wherein the decoder is a low density parity check (LDPC) decoder.

9. A magnetic drive apparatus, the apparatus comprising:

a detector configured to recover inter-symbol-interference (ISI) channel inputs for bits received by the magnetic drive apparatus and to generate first extrinsic probability mass function (PMF) information based on channel outputs, and wherein the detector further is configured to receive and use second extrinsic PMF information as a-priori information; and a decoder coupled to the channel detector and configured to receive the first extrinsic PMF information from the channel detector, the decoder configured to:

perform a symbol-based error correction code operation on symbols recovered from the received bits using the first extrinsic PMF information, generate full PMF information using the first extrinsic PMF information, and generate the second extrinsic PMF information for use by the channel detector.

10. The apparatus as set forth in claim 9, wherein the channel detector is one of: a maximum-a-posteriori (MAP) detector; and a max-log-MAP.

11. The apparatus as set forth in claim 9, wherein the channel detector is a soft output Viterbi algorithm (SOVA) detector.

12. The apparatus as set forth in claim 9, wherein the decoder is configured to generate the second extrinsic PMF information by removing input of the first extrinsic PMF information from the full PMF computed by the decoder.

13. The apparatus as set forth in claim 9, wherein the detector is configured to use the second extrinsic PMF information in a turbo equalization operation.

14. The apparatus as set forth in claim 9, further comprising a symbol based inverse interleaver coupled to the output of the detector, the symbol based inverse interleaver configured to interleave the first extrinsic PMF information generated by the detector.

15. The apparatus as set forth in claim 9, wherein the decoder is a low density parity check (LDPC) decoder.

16. A method for decoding data, the method comprising:

receiving bits by a receiver;

recovering, by a channel detector, inter-symbol interference (ISI) channel inputs for the received bits;

generating, by the channel detector, first extrinsic probability mass function (PMF) information based on channel outputs;

performing a symbol based error correction code operation on symbols recovered from the received bits using the first extrinsic PMF information; and generating full PMF information using the first extrinsic PMF information; and generating second extrinsic PMF.

17. The method as set forth in claim 16, wherein the channel detector is one of: a maximum-a-posteriori (MAP) detector; a max-log-MAP; and a soft output Viterbi algorithm (SOVA) detector.

18. The method as set forth in claim 16, further comprising:

receiving, by the channel detector, the second extrinsic PMF generated by the decoder; and using the second extrinsic PMF in a turbo equalization operation.

19. The method as set forth in claim 16, further comprising at least one of:

inverse interleaving the first PMF information; and symbol interleaving the full PMF information.

20. The method as set forth in claim 16, wherein performing a symbol based error correction code operation is performed by a low density parity check (LDPC) decoder.

* * * * *